BEST AVAILABLE COPY
POND & RICHARDSON.
Carbureter.
No. 2,455.
Reissued Jan. 15, 1867.
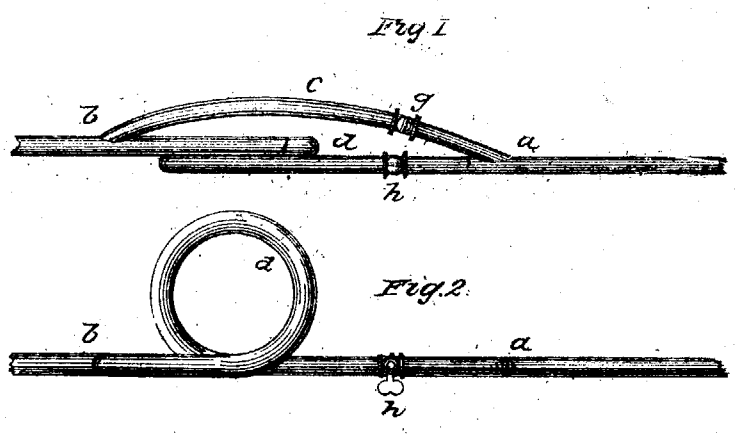
Witnesses
Jos L. Coombs
W. Bailey
Inventor
Pond & Richardson
by P. Pollock
their atty

UNITED STATES PATENT OFFICE.

E. A. POND AND M. S. RICHARDSON, OF RUTLAND, VERMONT.

IMPROVEMENT IN GAS APPARATUS.

Specification forming part of Letters Patent No. 53,482, dated March 27, 1866; Reissue No. 2,455, dated January 15, 1867.

*To all whom it may concern:*

Be it known that we, ERASMUS A. POND and MARK S. RICHARDSON, both of Rutland, in the county of Rutland and State of Vermont, have invented certain new and useful Improvements in Gas-Machines or Apparatus for Generating Illuminating-Gas; and we hereby declare the following to be a full, clear, and exact description of the same.

Our invention relates to the application of motive power to machines generating illuminating-gas by the passage of air through a medium which charges it with hydrocarbon vapors. To this effect air is forced through a vessel containing the hydrocarbon, either in a liquid or aeriform condition, in such manner and by means which insure the air becoming duly charged with vapor. Heretofore this has been effected by combining with a vaporizer of suitable construction a blast-wheel or air-pump or equivalents actuated by weight or spring-power mechanism. The former mode—that is to say, the forcing of air by means of a weight—is particularly applicable to stationary machines of limited capacity and calculated to run for a comparatively short period of time, while the latter—*i. e.*, in which the air is impelled by mechanism actuated by a spring—although both applicable to stationary and portable machines, loses its advantages when applied to large machines. From this it will be seen that the gas-machines as heretofore constructed are not adapted for use in large hotels, railroad-trains, steamboats, factories, and other like establishments without the inconvenience attending the constant winding of the springs or adjustment of weights in order to maintain a constant pressure and regular flow of gas.

The object of this invention therefore is to remedy this deficiency, and we have accomplished this by making use of the steam generally found in such places, or of the gas generated by the machines, to operate the air-forcing apparatus in the manner substantially as hereinafter explained. Thus, for railroad-train purposes we provide the locomotive-engine, at a part accessible to and so as to be under the control of the engineer, with a steam-cylinder receiving its supply of steam from the locomotive-boiler and working a little air-pump which forces the air through a vaporizer of suitable construction, or, preferably, one constructed in accordance with our invention for which an application for Letters Patent of the United States is now pending.

The air charged with the vapor of hydrocarbon fluid may be conveyed by means of pipes or tubes to the front of the locomotive and furnish the head-light and through all the passenger-cars. By this arrangement the pressure may also be regulated by the engineer by his working the pump with more or less speed, as circumstances may demand.

In cold weather, when there is danger of the illuminating-gas condensing, or of the fluid sluggishly evaporating, we use heaters—such as sand-baths or hot-water tanks—in which the air-pipe may be coiled before passing into the evaporating-vessel. The air passing through the coil is heated to the requisite temperature to facilitate the formation of hydrocarbon vapor in its passage through the fluid and to prevent the condensation of the gas formed. Other means—such as the placing of the vaporizer in a heated medium, or the laying of the pipe in contact with the boiler or fire-box, &c.—may be adopted.

In the accompanying drawing we have shown a pipe which may be used both in summer and winter. At *a* the pipe branches off into two pipes, *c* and *d*, both of which are provided with cocks *g* and *h*. The branch *d*, being longer, is coiled and placed in a heater, while the branch *c* passes outside of the heater and connects at *b* with the main pipe. From this arrangement it will be understood that when the outside temperature is insufficient to maintain the volatility of the fluid or to prevent the gas from condensing cock *g* is shut, causing the air to pass through the coil, and consequently through the heater, before it can reach the vaporizer; and, vice versa, when the outside temperature is warm, then the cock *h* is closed and the air allowed directly to pass to the vaporizer, and thence to the burners.

We have given in illustration of our invention the application of steam as motive power in railroad-cars and on locomotives; but it will be understood that a precisely-similar arrangement can be employed whenever there is a local boiler, as in hotels, factories, &c. The arrangement of pump may be that which occupies least space, and that which is of the simplest construction and most easily put in operation and regulated. The arrangement we give preference to is securing the steam and air cylinders to a bed-plate common to both. The two pistons belonging respectively to the air and steam cylinders are coupled, being mounted upon the same rod whose movement, by means of an arm and cams or stops on the valve-rod, is transmitted to actuate the valves in the steam-cylinder and in the air-cylinder.

We do not wish to be understood as confining ourselves to this arrangement of steam-pump, as many other arrangements may be found suitable and convenient. Steam, however, need not necessarily constitute the motive power to force air to and through the vaporizer. We also propose to use the gas generated in or by the gas-machine as the motive power which supplies to the apparatus the air necessary for the formation of the gas. A gas-engine constructed according to Lenore's, Hugon's, or other plan may work an air-pump or blast-wheel of a gas apparatus and be supplied from it, so that the engine generates both its own gas and the gas required for illuminating purposes. Of course to start the engine an auxiliary gas apparatus or the working by hand is required until sufficient gas is generated for motive power—*i. e.*, for supplying the engine.

Having thus fully described our said invention and the manner in which the same is or may be carried into effect, we claim—

1. The use of hydrocarbureted air for head-lights for locomotives, substantially as herein described.

2. The application to locomotive-engines of an air-pump operated from an independent steam-cylinder deriving its steam from the locomotive-boiler, said air-pump being connected with a suitable apparatus for carbureting atmospheric air and with burners in the head-lantern and the cars, substantially as set forth.

3. The construction of the air-pipe with branches and stop-cocks, so as to supply the vaporizer with hot or cold air at pleasure, substantially as set forth.

4. Generating illuminating-gas by means of an apparatus consisting of the combination, with a vaporizer, of an air-pump driven by a gas-engine, which receives its supply of gas from the gas-generator, substantially as herein described.

In testimony whereof we have signed our names to this specification before two subscribing witnesses.

E. A. POND.
M. S. RICHARDSON.

Witnesses:
JAS. MERRELL,
H. C. MERRELL.